(12) United States Patent
Tages

(10) Patent No.: US 9,060,580 B2
(45) Date of Patent: Jun. 23, 2015

(54) MOBILE DEVICE CASE HAVING TENSION ELEMENTS

(71) Applicant: A.G. Findings & Mfg. Co., Inc., Fort Lauderdale, FL (US)

(72) Inventor: Fernando Tages, Coral Springs, FL (US)

(73) Assignee: A.G. Findings & Mfg. Co., Inc., Fort Lauderdale, FL (US)

( * ) Notice: Subject to any disclaimer, the term of this patent is extended or adjusted under 35 U.S.C. 154(b) by 0 days.

(21) Appl. No.: 13/886,607

(22) Filed: May 3, 2013

(65) Prior Publication Data

US 2013/0292269 A1 Nov. 7, 2013

Related U.S. Application Data

(63) Continuation-in-part of application No. 13/847,878, filed on Mar. 20, 2013.

(60) Provisional application No. 61/642,863, filed on May 4, 2012.

(51) Int. Cl.
| | |
|---|---|
| *A45C 11/00* | (2006.01) |
| *B65D 85/00* | (2006.01) |
| *H04B 1/3888* | (2015.01) |
| *H05K 5/00* | (2006.01) |

(52) U.S. Cl.
CPC ............. *A45C 11/00* (2013.01); *H05K 5/0086* (2013.01); *H04B 1/3888* (2013.01); *A45C 2011/002* (2013.01); *A45C 2200/10* (2013.01)

(58) Field of Classification Search
CPC ...... H04M 1/18; H04B 1/3888; H05K 5/0086
USPC ................ 455/575.8; 206/701, 320, 521, 591
See application file for complete search history.

(56) References Cited

U.S. PATENT DOCUMENTS

| | | | |
|---|---|---|---|
| 3,979,016 | A | 9/1976 | Frater |
| 5,626,776 | A | 5/1997 | Morris, Jr. |
| 5,826,672 | A | 10/1998 | Holter et al. |
| 6,226,501 | B1 * | 5/2001 | Weadon et al. ............ 455/575.3 |
| 7,255,228 | B2 | 8/2007 | Kim |
| 7,907,394 | B2 * | 3/2011 | Richardson et al. ........ 361/679.3 |
| 7,933,122 | B2 * | 4/2011 | Richardson et al. ..... 361/679.55 |
| 8,439,191 | B1 * | 5/2013 | Lu ................................. 206/320 |
| 8,443,971 | B1 * | 5/2013 | Green et al. .................. 206/320 |
| 8,504,127 | B2 * | 8/2013 | Altschul et al. ............ 455/575.8 |
| 2002/0085342 | A1 * | 7/2002 | Chen et al. .................... 361/683 |
| 2008/0251512 | A1 | 10/2008 | Griffin et al. |
| 2011/0049005 | A1 * | 3/2011 | Wilson et al. ................. 206/701 |

* cited by examiner

*Primary Examiner* — Fenn Mathew
*Assistant Examiner* — Don M Anderson
(74) *Attorney, Agent, or Firm* — Christopher & Weisberg, P.A.

(57) ABSTRACT

A housing sized to at least partially retain the mobile device, the housing defining an interior and a plurality of side wall portions substantially surrounding the interior; and at least one resiliently movable tension element molded to a portion of the side wall portions, the at least one resiliently movable tension element extending into the interior of the housing.

14 Claims, 11 Drawing Sheets

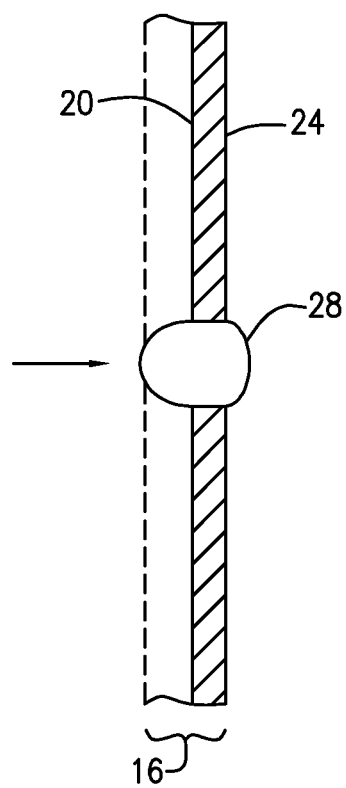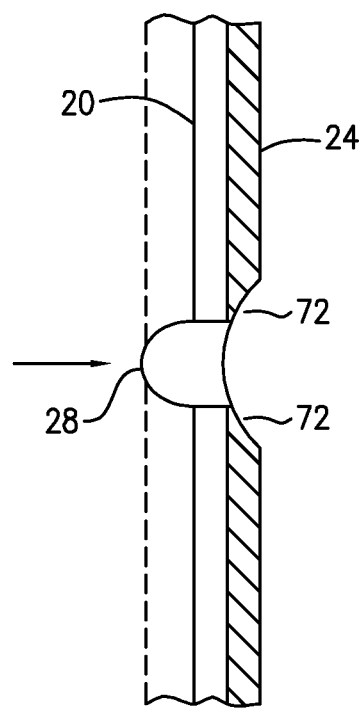
*FIG. 10*    *FIG. 11*

MOBILE DEVICE CASE HAVING TENSION ELEMENTS

CROSS-REFERENCE TO RELATED APPLICATION

This application is a Continuation-in-Part application of U.S. application Ser. No. 13/847,878 filed Mar. 20, 2013 entitled MOBILE DEVICE CASE HAVING INTEGRATED LATCH and further claims priority to U.S. Provisional No. 61/642,863, filed May 4, 2012 entitled MOBILE DEVICE CASE LATCH, the entirety of which is incorporated herein by reference.

STATEMENT REGARDING FEDERALLY SPONSORED RESEARCH OR DEVELOPMENT n/a

FIELD OF THE INVENTION

The present invention relates to protective mobile device cases, and in particular, a protective mobile device case having co-molded movable tension elements.

BACKGROUND OF THE INVENTION

Mobile electronic device cases typically are constructed with either or both of soft resilient materials, such as silicone, or rigid materials, such as polycarbonate to provide both a sturdy feeling to the user and impact protection. However, many of such cases are sized to rightly conform to the mobile electronic device retained within the case such that while a portion of the case may be composed of a resilient material, an impact force received by the case may be transferred directly to the mobile electronic device, which may damage the mobile electronic device.

Cases have further been constructed to space the mobile electronic device a distance from an internal surface of the case such that during an impact event, the corners of the mobile electronic device do not contact the interior walls of the case. While such cases provide some degree of impact protection, there is no compact and sufficient structure or mechanism within the case to absorb at least a portion of the kinetic energy transferred from the ground or other object which the case contacts during an impact event, to the phone itself. That is, while current cases often increase protection by thickening the walls of the case or adding energy absorption structure to the outside of the case, current cases lack internal kinetic energy deflection or absorption structures such that current cases either transfer the impact force toward the interior of the case and the mobile electronic device or are large and bulky in size.

SUMMARY OF THE INVENTION

The present invention advantageously provides a mobile device case with movable tension elements. The case includes a housing sized to at least partially retain a mobile device, the housing defining an interior and a plurality of side wall portions substantially surrounding the interior. At least one resiliently movable tension element molded to a portion of the side wall portions is included. The at least one resiliently movable tension element extends into the interior of the housing.

In another embodiment, the case includes a housing sized to at least partially retain a mobile device. The housing defines an interior surface, an exterior surface, and a plurality of side wall portions substantially defining the interior, each of the plurality of side wall portions having a major axis. At least one resiliently movable tension element affixed to the exterior surface of each of the plurality of side wall portions is included, the at least one resiliently movable tension element extends into the interior of the housing. The at least one resiliently movable tension element is movable from a first biased position in which the resiliently movable tension element extends into the interior of the housing to a second position in which the at least one resiliently movable tension element is substantially co-planar with the major axis of each of the corresponding side wall portion.

In yet another embodiment, the case includes a housing sized to at least partially retain a mobile device. The housing defining an interior, a plurality of side wall portions substantially surrounding the interior and a bottom portion, each of the plurality of side wall portions and the bottom portion including: an exterior surface; an interior surface having a substantially rigid layer, the substantially rigid layer having a plurality of openings; and a resilient layer of material disposed on at least a portion of the exterior surface; at least one resiliently movable tension element molded to the exterior surface of each of the plurality of side wall portions, the at least one resiliently movable tension element extending through a corresponding opening in the substantially rigid layer into the interior of the housing. The at least one resiliently movable tension element being configured to space the mobile device a distance away from the plurality of side wall portions when the mobile device is retained within the housing.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 10 is a top cross-sectional view of the movable tension elements shown in FIG. 9; and FIG. 11 is a top view of Region B shown in FIG. 1 showing an alternative embodiment of the tension elements shown in FIG. 1.

DETAILED DESCRIPTION OF THE INVENTION

Figure 1:
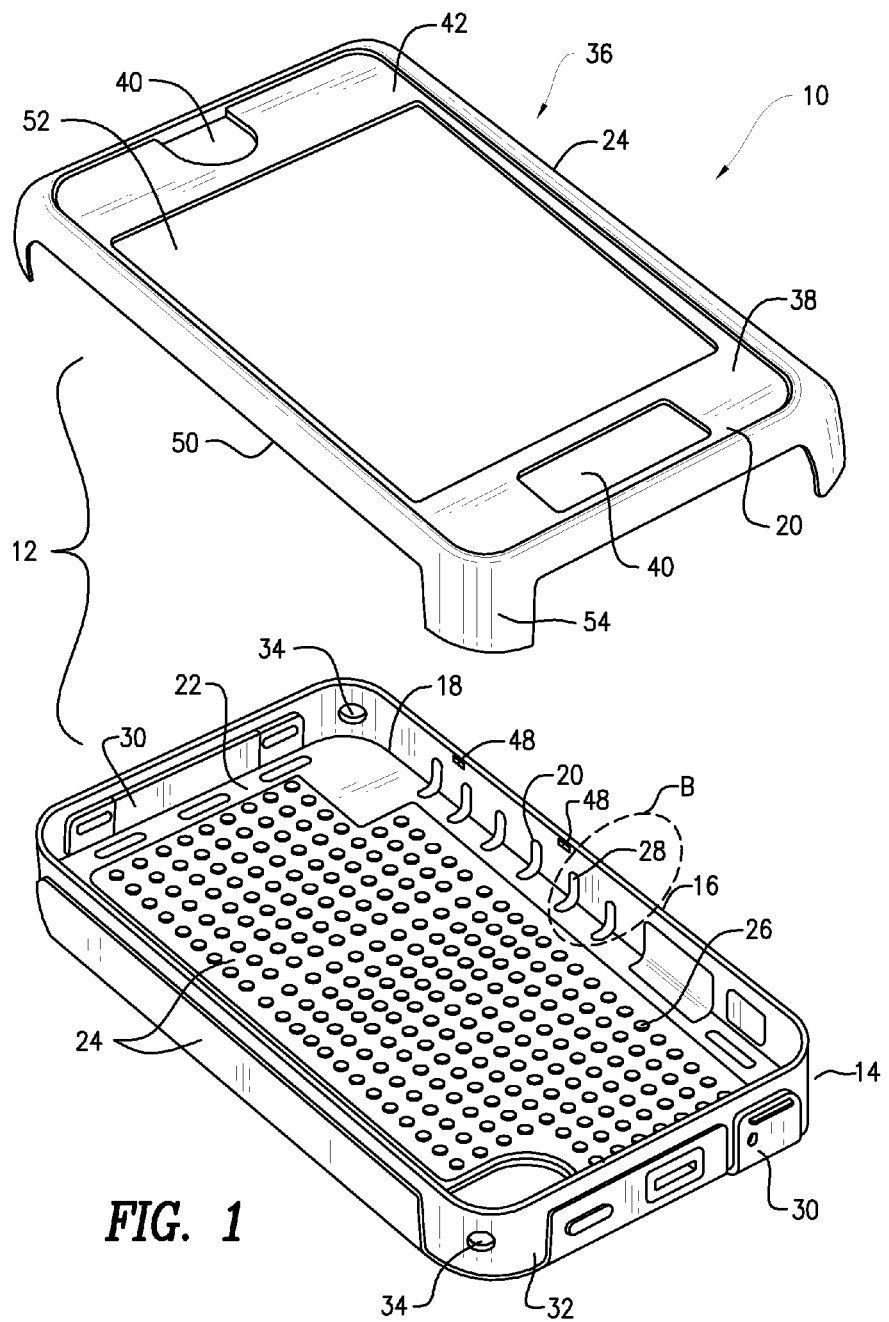
FIG. 1 is an exploded perspective view of a mobile device case constructed in accordance with the present invention.

Now referring to the drawings in which like reference designators refer to like elements, there is shown in FIG. 1 a mobile device case constructed in accordance with the principles of the present invention and designated generally as "10." The case 10 may include a housing 12 may be a multi-piece clam shell or a unitary structure sized to receive and retain a mobile device. The housing 12 may include a first portion 14 sized to receive and at least partially enclose the mobile device. For example, the dimensions of the first portion 14 may be pre-fabricated to contour a specific mobile device, for example an IPHONE, IPAD, or other mobile phone or tablet computer, and thus may vary depending on the size of the mobile device.

The first portion 14 may further include a plurality of side wall portions 16 defining a first perimeter 18 around the interior of the first portion 14. The side wall portions 16 surround the first portion 14 and may define a height substantially commensurate with a height of the mobile device housed within the first portion 14, or any height. In an exemplary embodiment, four side wall portions 16 are included on the first portion 14. The first portion 14 may include, and be at least partially composed of, a first material 20. The first material 20 may include a substantially rigid material, for example, polycarbonate (PC) or a similarly rigid material having a similar durometer hardness. The first material 20 may be included around the exterior of the side wall portions 16 and on a bottom portion 22 of the first portion 14. The first material 20 may further be contiguous around the first portion 14 such that side wall portions 16 are contiguously connected with the bottom portion 22 by the first material 20. Alternatively, the side wall portions 16 may be joined, in part, to the bottom portion 22 by other materials or may include gaps or slits along the perimeter 18 to provide for at least some flexion in the event of the an impact force being applied to the first portion 14.

Molded or affixed to the bottom portion 22 in the interior of the first portion 14 may be a second material 24. The second material 24 may be an elastomeric resilient material, for example, thermoplastic polyurethane (TPU) or other thermoplastic elastomers having a similar durometer hardness less than the durometer hardness of the first material 20. The second material 24 may span substantially the entire bottom portion 22 in the interior of the case and may further define a raised pattern of nubs 26, which may be any shape or size or pattern, that raise the mobile device a distance away from the bottom portion 22 when retained within the first portion 14. The nubs 26 may be composed of the second material 24, or other materials, and further operate to cushion and to provide friction to the mobile device when disposed within the first portion 14. In an exemplary configuration, the second material 24 is molded to the bottom portion 22 such that is spaced a distance away from the perimeter 18 and around at least a portion of the interior.

The second material 24 may further be molded or affixed onto the exterior surface of the side wall portions 16. For example, the second material 24 may extend up at least a portion of the side wall portions 16 on one or more of the side portions that comprise the side wall portions 16. In an exemplary configuration, the second material 24 may be molded on at least a substantial portion of the side wall portions 16, such that portion of the first material 20 may be exposed toward the top of the side wall portions 16 with a section of the side wall portions 16 including only the first material 20. The second material 24 may further be molded onto the side wall portion 16 to define one or more apertures allowing for sound to be emitted from the speakers through the apertures. The second material 24 may further allow for the actuation of one or more of the controls of the mobile device. For example, the second material 24 may define volume control bottoms that are operable to actuate the volume control buttons on the mobile device when pressed.

The second material 24 may further be molded into the first portion 14 such that a portion of the second material 24 joins a portion of the side wall portions 16 to the bottom portion 22 and further defines a portion of the side wall portions 16. For example, the first portion 14 may include a plurality of tension elements 28 adjoining the side wall portions 16 to the bottom portion 22. Each tension element 28 defines part of the side wall portions 16 and the bottom portion 22 and is further sized to space a mobile electronic device retained within the first portion 14 a distance away from the side wall portions 16. In particular, each tension element 28 may extend a distance from the side wall portions 16 and the bottom portion 22 toward the interior of the first portion 14. Each tension element 28 further operates as a spring to resist an impact force applied by the mobile device on the tension element 28 to cushion the mobile device when retained with the first portion 14. The second material 24 forming tension element 28 may extend through an opening in the first material 20 and form up with the second material 24 on the exterior of the side wall portions 16 and the bottom portion 22 such that the tension element 28 is resiliently movable in a spring-like manner through the opening in the first material 20.

The first portion 14 may further include one or more plugs 30 molded or affixed to the first portion 14. For example, the plugs 30 may be molded to a portion of the side wall portions 16 including the first material 20 and may be movable from a first position in which the plug 30 is securably inserted into an aperture defined by the first portion 14, to a second position in which the plug 30 is moved or pivoted a distance away from the first portion 14 to allow for insertion of headphones, power plugs, or other accessories. The plugs 30 may be composed of the second material 24 or other similar flexible materials.

Continuing to refer to FIG. 1, the first portion 14 further includes a plurality of corners 32. Each corner 32 may include an exposed portion of the first material 20 that defines the side wall portions 16. For example, a portion of the second material 24 spanning the side wall portions 16 on both sides of each corner 32 may taper or otherwise terminate on the corner 32 such that each corner 32 includes only the first material 20. Alternatively, one or more of the corners 32 may include a portion the second material 24 on the first portion 14. For example, the second material 24 may be included on the bottom of one or more corners 32 such that the second material 24 adjoins the portions of the second material 24 on the portion of the side wall portions 16 on both sides of each corner 32.

One or more of the corners 32 may define, or otherwise include, at least one first mating element 34. The first mating element 34 may be, for example, an aperture defined by the corner 32 in the exposed portion of the first material 20 between portions of the second material 24. For example, as shown in FIG. 1, the first mating element 34 is positioned at approximately the midpoint of the corner 32, although in other configurations, the first mating element 34 may be positioned at any position along the corner 32. The shape of the first mating element 34 may be circular, rectangular, or any shape or size. The first mating element 34 may be tapered inward such that the first mating element 34 defines a larger opening, e.g. diameter, toward the exterior of the first portion 14 compared to the opening of the corner aperture toward the interior of first portion 14. In an exemplary configuration, each corner 32 may include at least one first mating element 34 each having the same configuration, or alternatively, may be any shape or size.

Continuing to refer to FIG. 1, the housing 12 may further including a second portion 36 releaseably securable to the first portion 14. The second portion 36 may be composed of both the first material 20 and the second material 24. For example, the second portion 36 may include the first material 20 on an upper portion 38 of the second portion 36. The upper portion 38 may further defines a plurality of upper portion apertures 40 sized to accommodate the actuation of a push-button on the mobile device or to allow an unimpeded view for an image capture device on the mobile device. The upper portion 38 may define a substantially planar surface and may further define a substantially rectangular perimeter 42 with rounded edges composed of the first material 20. The perimeter 42 may extend orthogonally a distance away from the upper portion 38 and define a lip 44 (shown in FIG. 2) insertable within a portion of the first portion 14. The lip 44 may further define a one or more recesses 46 (shown in FIG. 2) sized to receive a complementary tab 48 on the first portion 14 to releasably secure the first portion 14 to the second portion 36.

Molded to a portion of the upper portion 38 may be the second material 24 extending a distance away from the substantially rectangular perimeter 42. The second material 24 molded to the upper portion 38 may be disposed around the perimeter 42 to provide a layer of cushion to the second portion 36. The second material 24 may further define a second perimeter 50 molded to and disposed around the perimeter 42. In particular, the second perimeter 50 may be molded atop the perimeter 42 and extend a longitudinal distance away from the perimeter 42.

The second portion 36 may include a screen protector 52 which is substantially commensurate in size with a touch-screen of a mobile device retained within the first portion 14. The screen protector 52 may be transparent and flexible or substantially rigid and may further define electrical properties such that the touch-screen of the mobile device may be actuated through the screen protector 52. The screen protector 52 may further be substantially coplanar with the upper portion 38. Optionally, the second portion 36 may not include the screen protector 52.

Extending away from second perimeter 50, in a direction substantially orthogonal from screen protector 52, may be at least one flap 54. For example, four flaps 54 may be included on the second portion 36 extending from the second perimeter 50 although any number of flaps 54 may be included. The flaps 54 may be substantially commensurate in height and width as the corners 32 as to provide protection to the corners 32 during an impact event in which the housing 12 is exposed to an impact force. For example, both the corners 32 and the flaps 54 may be substantially rectangular in shape with a concave curvature. In an exemplary configuration, the flaps 54 are joined to the second perimeter 50 and form a contiguous section of the second material 24. In other embodiments, the flaps 54 may be connected to the perimeter 42 or the second perimeter 50 by a connector (not shown), such as a living hinge, discrete hinge, or other connector, that facilitates movement of the flaps 54, such that the second perimeter 50 is not contiguous with the flaps 54. The flaps 54 may further be movable from a first position in which the flaps 54 are substantially orthogonal to the screen protector 52 and biased to the first position at least a second position in which the flaps 54 are substantially coplanar with the screen protector 52. The flaps 54 may further vary in thickness compared to a thickness of the second material 24 disposed on either or both of the first portion 14 and the second portion 36. In particular, the flaps 54 may include the same or similar thickness as the thickness of the second material 24 that defines the second perimeter 50 or the second material 24 that is disposed on opposite sides of the corner 32. In other embodiments, the thickness of the flaps 54 may be greater than the thickness of the second material 24 on the first portion 14 such that it protrudes a greater distance away from the corner 32 when the first portion 14 is removeably coupled to the second portion 36 as discussed in more detail below.

Figure 2:
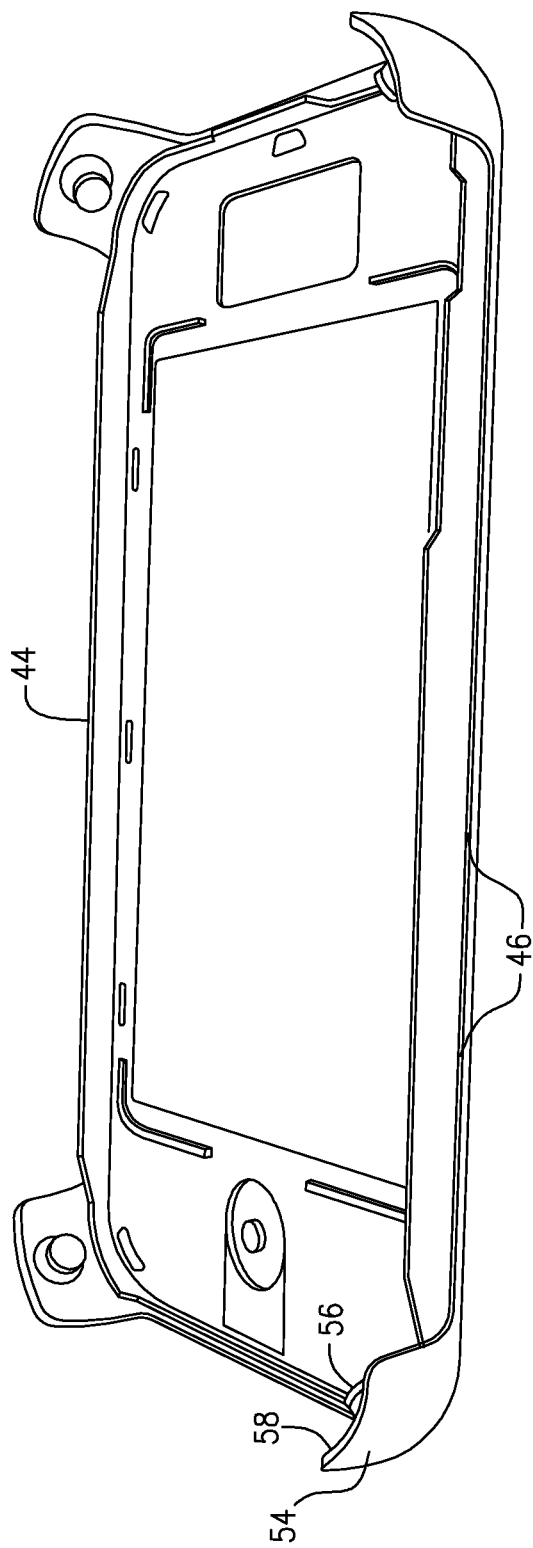
FIG. 2 is an inside view of the second portion of the mobile device case having a latch shown in FIG. 1.
Figure 3:
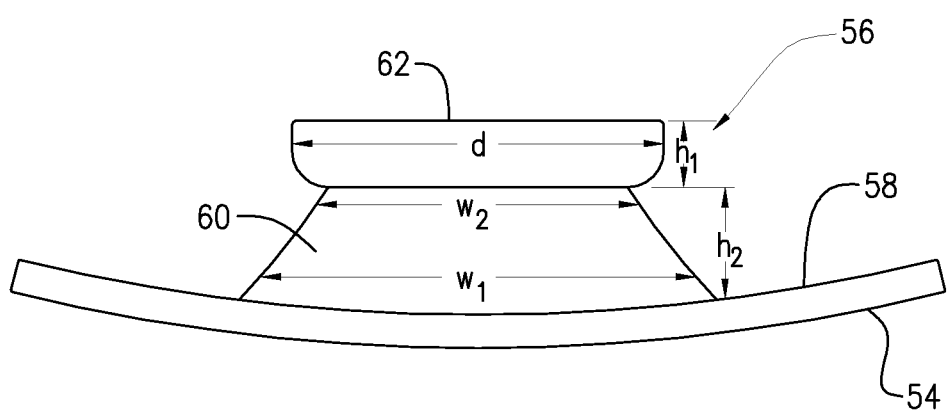
FIG. 3 is a zoomed in side view of a flap shown in FIGS. 1 and 2.

Referring now to FIGS. 2 and 3, each of the flaps 54 may include, or otherwise define, a second mating element 56 extending a distance away from an interior surface 58 of each flap 54. For example, each flap 54 may include at least one second mating element 56 positioned at substantially the center point of each flap 54. The second mating element 56 may be a nub or a protuberance composed of the same material as the flap 54, for example, the second material 24, or the second mating element 56 may be composed of a different material, for example, the first material, 20. The second mating element 56 may define a first section 60 subjacent to a second section 62. The first section 60 may be molded to the flap 54 and may taper inward as it extends from the flap 54. For example, first section 60 may be substantially frusto-conical in shape, or any shape, and may further define a width (w1) of the first section 60 proximate the interior surface 58 greater than a width (w2) of a width of the first section 60 distal the interior surface 58.

Molded or contiguous with the first section 60 is the second section 62 positioned distal the first section 60. The second section 62 may be substantially cylindrical in shape and may define a diameter (d) greater than the width (w2) of the first section 60 distal the interior surface 58 and smaller than the width (w1) of the first section 60 proximate the interior surface 58. In the configuration shown in FIG. 3, the second section 62 defines a height (h1) less than a height (h2) of the first section 60.

Figure 4A:
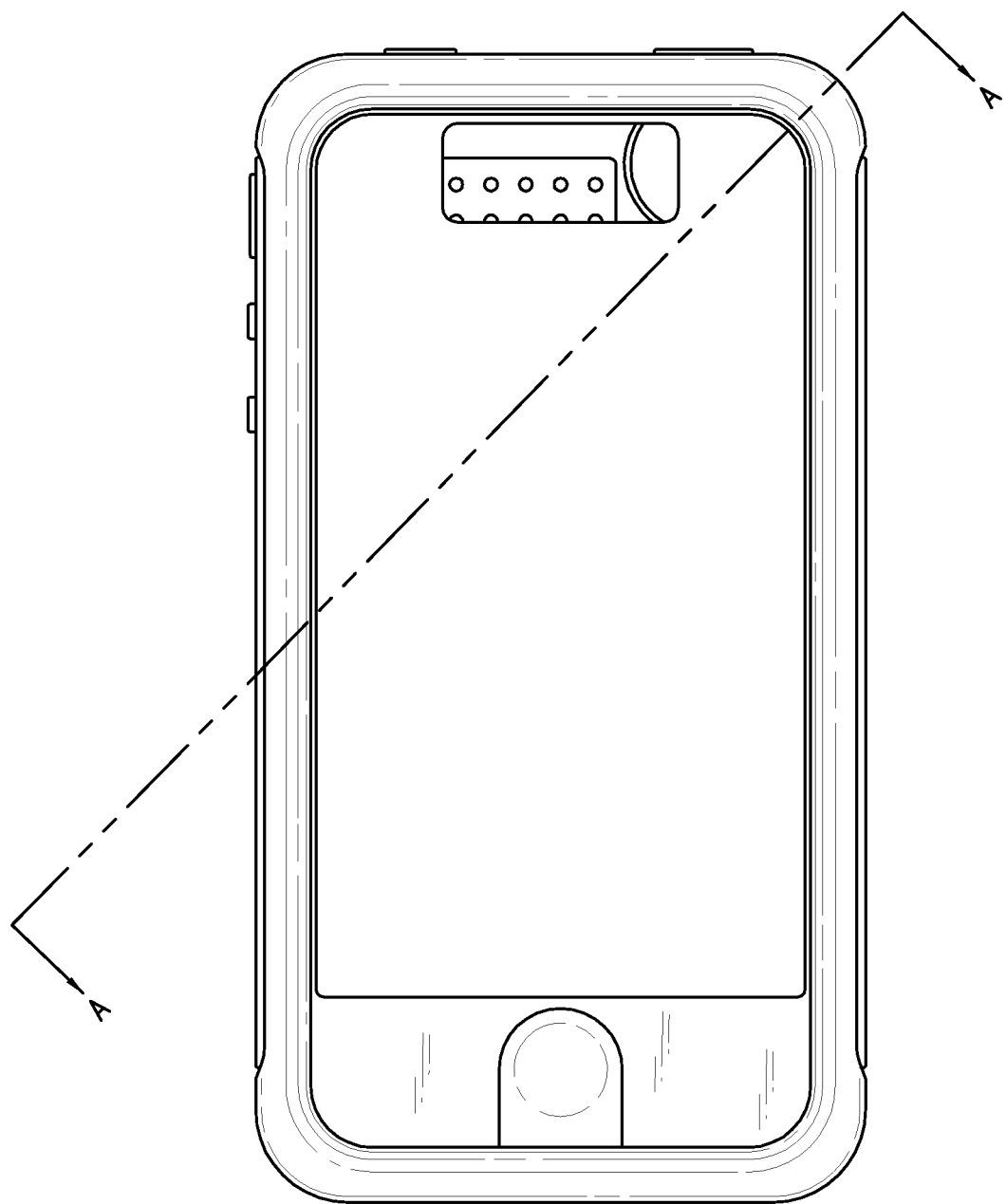
FIG. 4A is a top view of the assembled mobile device case shown in FIG. 1.
Figures 4B, 4C:
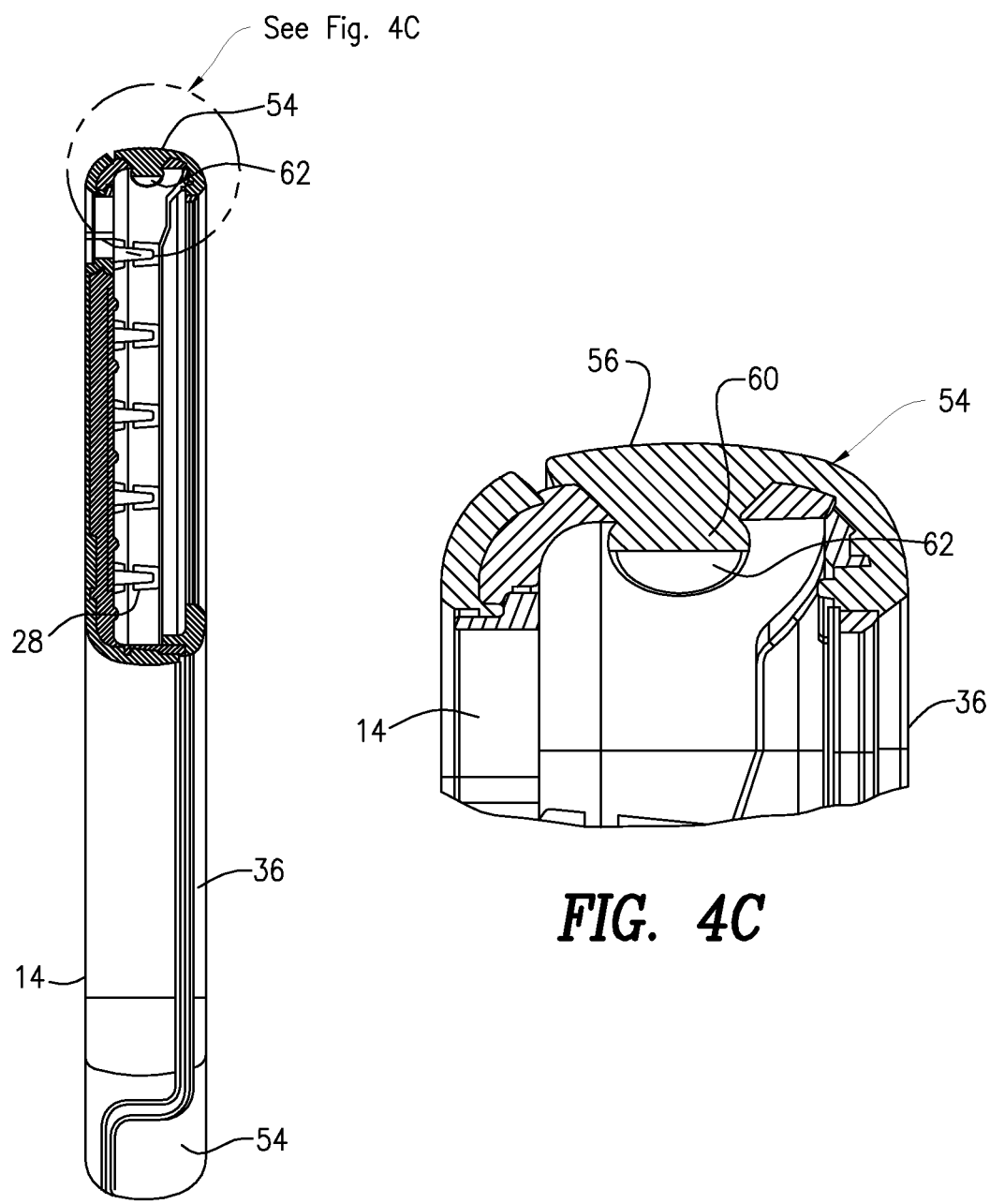
FIG. 4B is a cross-sectional view of showing a second mating element on the flap of FIG. 3 inserted within a first mating element across Section A-A.
FIG. 4C is an enlarged view of the dashed region shown in FIG. 4B.

Referring now to FIGS. 4A-4C, when the second portion 36 may engage the first portion 14, for example, by inserting the lip 44 within a portion of the first portion 14 such that tabs 48 are inserted within the recesses 46. When the tabs 48 are inserted within the recesses 46, the first portion 14 may be removeably secured to the second portion 46 with the second mating element 56 of the flaps 52 resting against the first mating element 34 such that the corner 32 is at least partially exposed. In an exemplary configuration, a pressing force applied to the second mating element 56 forces the entire second section 62 of the second mating element 56 into the first mating element 34 such that it extends into the interior of the first portion 14 and at least a portion of the first section 60 into the interior of the first portion 14. Owing to the configuration and size of the second mating element 56 with respect to the size and configuration of the first mating element 34, when the second mating element 56 is pressed within the first mating element 34, the second mating element 56 snaps into the corner 32 and the flaps 52 are pressed adjacent an exterior surface of the corners 32. In particular, the first mating element 34 tapers outward and the first section 60 of the second mating element 56 tapers inward. Additionally, the second section 62 is wider that the smallest diameter of the first mating element 34. Thus, the second section 62 is partially compressed when traversing the first mating element 34 and when the second section is disposed within the interior of the first portion 14 after passing through the first mating element 34, the flap 52 is secured against the exterior surface of the corner 32. As such, event the flaps 52 are secured to the corners 32 in a manner then prevents them from moving or shifting during an impact event.

Figure 5:
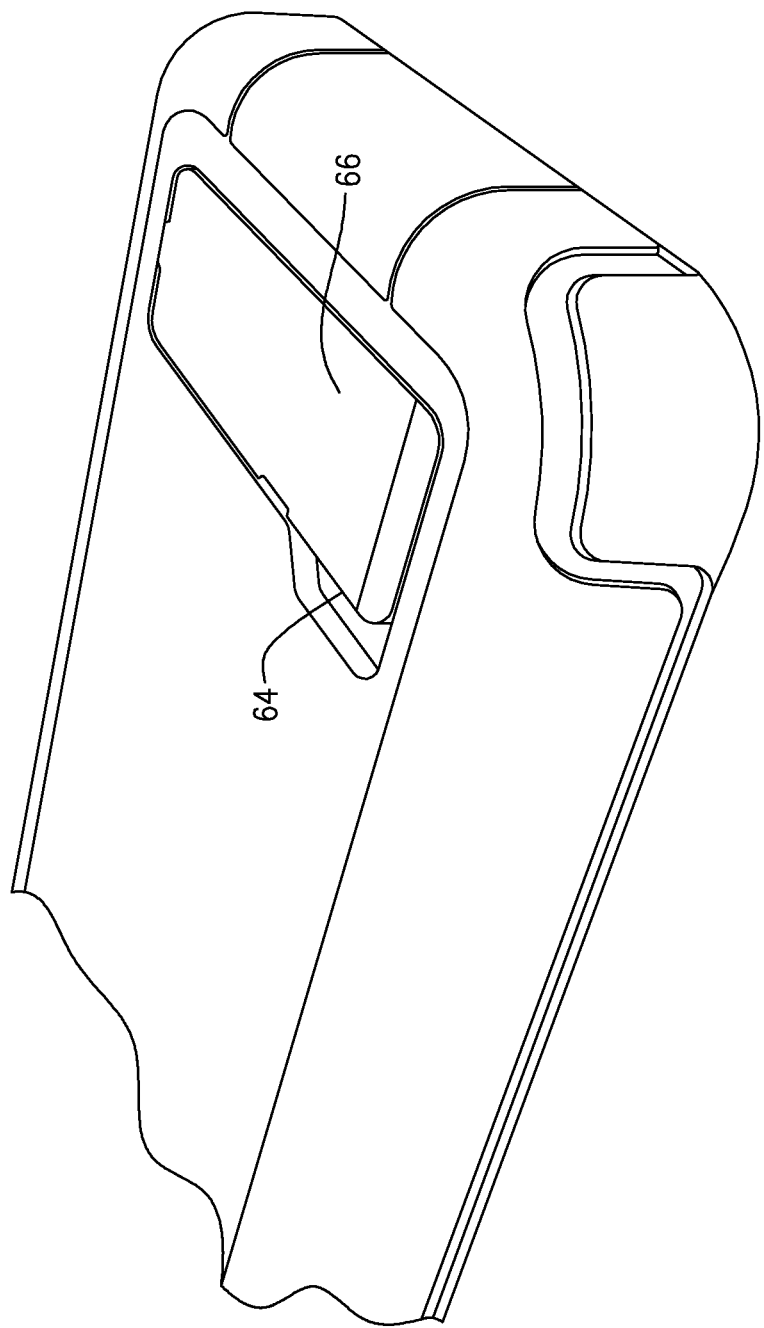
FIG. 5 is a back view of the first portion of the mobile device case shown in FIG. 1 with a flap of the second portion proximate a first mating element.
Figure 6:
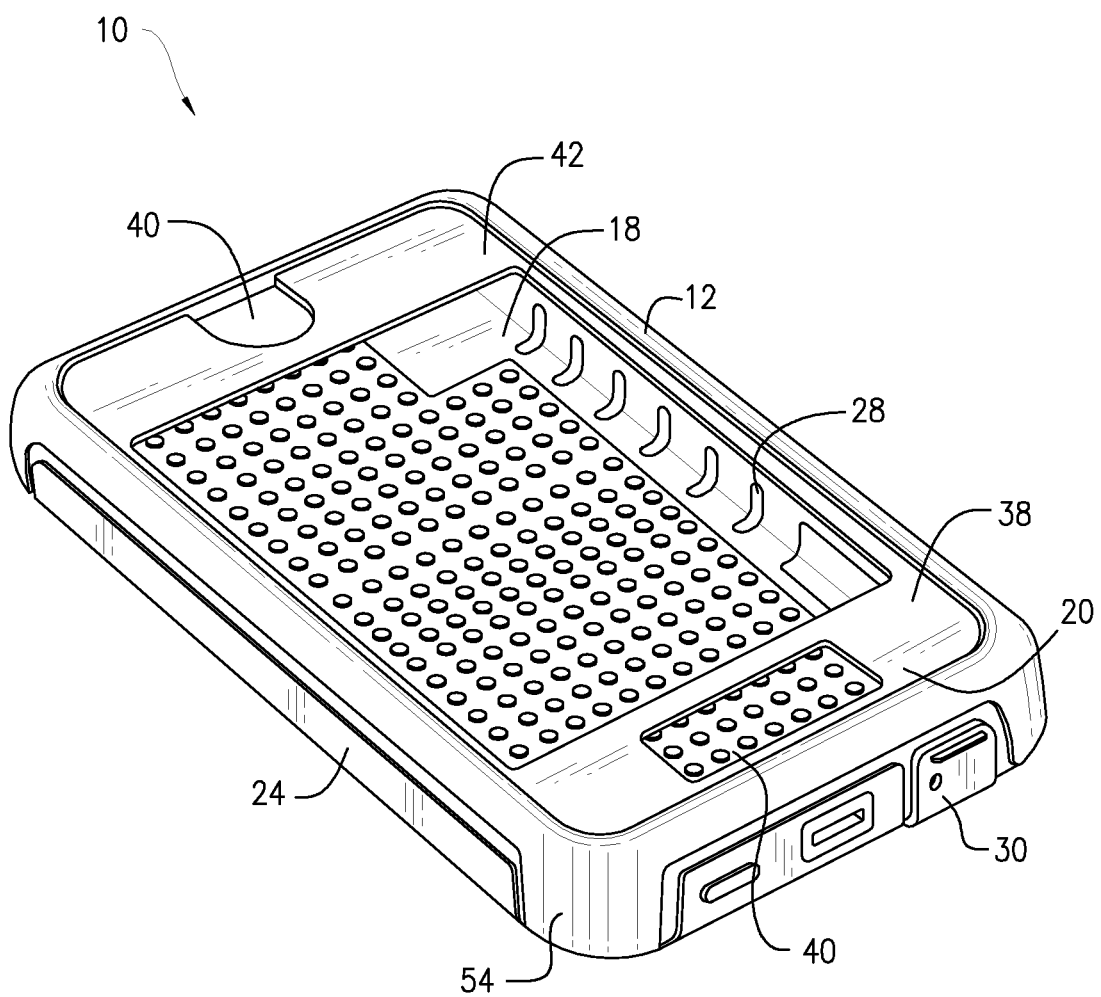
FIG. 6 is an assembled view of the mobile device case shown in FIG. 1.

Referring now to FIGS. 5 and 6, the flaps 52 provide a resilient cushioned second layer of material 24 to the corners 32 when the second mating element 56 is inserted within the corner aperture 34. In an exemplary configuration, four flaps 52 are included on the second portion 36 and four corner apertures are included on the first portion 14. As such, each flap 52 may be pressed against each of the four corners 32 such that each corner 32 of the first portion 14 includes a flap 52. When the second mating element 56 is inserted within the corner aperture the flap 52 may be pressed against the corner 32 such that a portion of the corner 32 remains exposed. For example, a portion of the corner 32 proximate the bottom portion 22 may be exposed when the flap 52 is positioned adjacent the corner 32. In such a configuration, the user of the mobile device case 10 may release the flaps 52 from the corner 32 by pulling on a portion of the flap 52 proximate the exposed portion of the corner 32 with pulls the second mating element 56 out from the first mating element 34. When each of the four second mating elements 56 are released from their respective corner apertures 34, the first portion 14 may be detached from the second portion 36 by pulling the second portion 36 away from the first portion 14.

In other configurations, the flap 52 may not include the second mating element 56, but instead may define a substantially flat surface composed of the second material 24 to friction-fit with the corner 32 which may also be molded with, or otherwise composed of the second material 24.

As shown in FIG. 5, the exterior surface of the bottom portion 22 may include an indentation 64 sized to receive a kickstand 66 coupled to the bottom portion 22. The kickstand 66 may be movable from a first position in which it is received within the indentation and substantially co-planar with exterior surface of the bottom portion 22 to a second position in which the kickstand 66 is extend to an angle approximately 45 degrees such that the mobile device case may rest on a surface at any angle.

Figure 7:
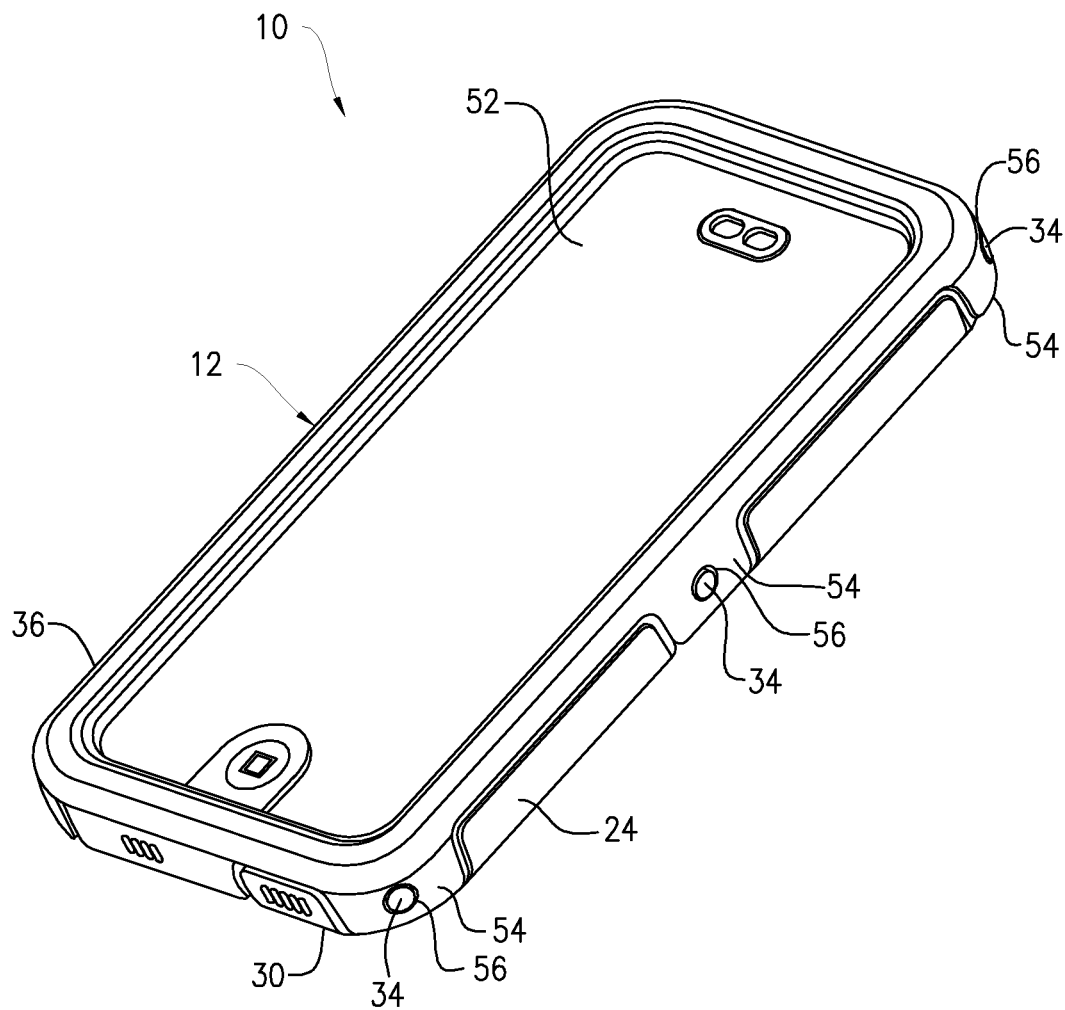
FIG. 7 is perspective view of another embodiment mobile device case constructed in accordance with the present invention.

Referring now to FIG. 7, in another embodiment, the first mating element 34 and the second mating element 56 may be reversed, such that the first mating element 34 may be a protuberance or a nub extending a distance away from the first portion 14, and the second mating element 56 may be an aperture defined by the flaps 54 of the second portion 36. The reversal of the first mating element 34 and the second mating element 56 may provide for a substantially water resistant housing 12 when the first portion 14 is releaseably secured to the second portion 36. The first mating element 34 and the second mating element 56 may releaseably coupled to each other in the same manner as the embodiment shown in FIG. 6. Because, however, the first mating element 34 is a protuberance and disposed on the first portion 14 rather than an aperture, the first portion 14 is more water resistant than other embodiments in which the first mating element 34 is an aperture.

Continuing to refer to FIG. 7, the first portion 14 may include any number of first mating elements 34 extending away from an exterior surface of the side wall portions 16. For example, as shown in FIG. 7, three first mating elements 34 are disposed along a side wall 16 of the first portion 14. In particular, two first mating elements 24 are included at two of the corners 32 of the first portion 14 and a third first mating element 34 is included at substantially the midpoint of one of the side wall portions 16. An additional three first mating elements 34 are included on the on the opposite side wall 16 of the first portion 14 (not shown) for a total of six first mating elements 34 disposed on the side wall portions 16. Although not shown, any number of first mating elements 34 may be disposed symmetrically or asymmetrically around the side wall portions 16 or any portion of the first portion 14. A corresponding second mating element 56 may be included and positioned on the second portion 36 to mate with its corresponding first mating element 34 on the first portion 14. For example, if six first mating elements 34 are included on the first portion, six second mating elements 56 may be included on the second portion 36.

Figure 8:
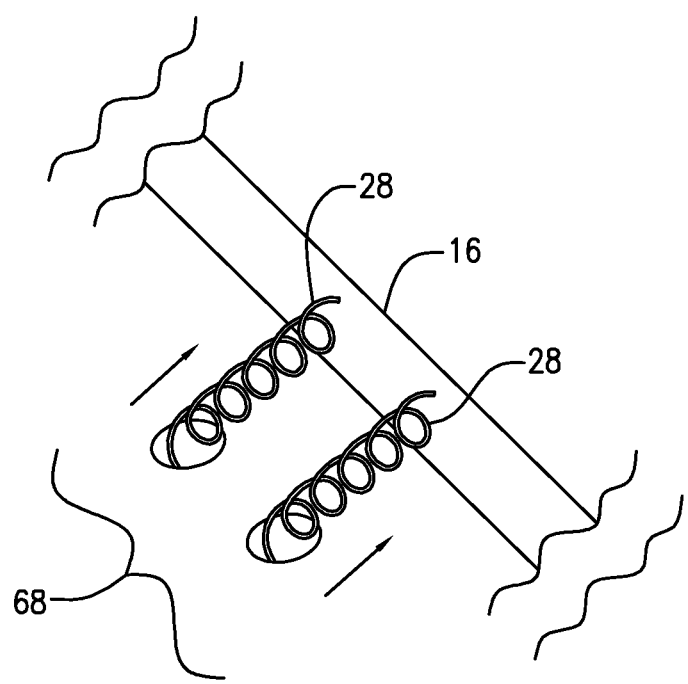
FIG. 8 is a top view of Region B shown in FIG. 1 showing an alternative embodiment of the tension elements shown in FIG. 1.

FIG. 8, shows an alternative embodiment of the tension elements 28 shown in FIG. 1. The first portion 14 may include a plurality of resiliently movable tension elements 28 on an interior surface of the side wall portions 16 and/or on the bottom portion 22 to create a deflection zone 68 in which the mobile device may move or otherwise impact with when exposed to an impact force. As used herein, the terms "movable" and "movement" refer to displacement of an object from a first position to a second position, rather than a compression of and expansion of the same object. Each movable tension element 28 defines part of the side wall portions 16 and/or the bottom portion 22, and is further sized to space a mobile electronic device retained within the first portion 14 a distance away from the side wall portions 16 and/or from the bottom portion 22. In particular, each movable tension element 28 may extend a distance from the an exterior surface of the side wall portions 16 and the bottom portion 22 toward the interior of the first portion 14, and is in direct contact with the mobile device when the mobile device is retained within the first portion 14. Each movable tension element 28 may be a spring, or other resilient element or soft element that resists an impact force applied by the mobile device on the movable tension element 28 and biases the mobile device away from the substantially rigid first material 20 on the interior surface of the first portion 14.

For example, one or more of the movable tension elements 28 may be composed of an elastic spring including a nub at its distal end that applies a force on the mobile device when the mobile device is retained within the housing 12. In the event the housing 12 is dropped or otherwise is exposed to an impact force, the movable tension elements 28 may be displaced toward the interior surface of the side wall portions 16 and/or the interior surface of the bottom portion 22 if the movable tension elements 28 are included on the bottom portion 22. In a particular embodiment, each movable tension element 28 is capable of being displaced such that it is substantially co-planar with the major axis of the interior surface when displaced. As used herein, the major axis of the side wall portions 16 is the axis that defines the length or a width of the housing 20 along the side wall. When the displacement forces on the movable tension elements 28 are removed, the movable tension elements 28 resiliently move back into their original position.

Alternatively, the movable tension elements 28 may be molded or otherwise connected directly to the exterior surface of the side wall portions 16 and the exterior surface of the bottom portion 22 such that an impact force exerted on the movable tension elements 28 exerts a force directly on the second material 24 to cause a outward deflection in the second material 24. For example, the movable tension elements 28 may be substantially T-shaped such that the movable tension elements 28 include a portion of the second material 24 that defines the exterior surface of the first portion 14. In the event of an impact event, the movable tension elements 28 may deflect a distance outward from the exterior surface of the side wall portions 16 and/or bottom portion 22.

Figure 9:
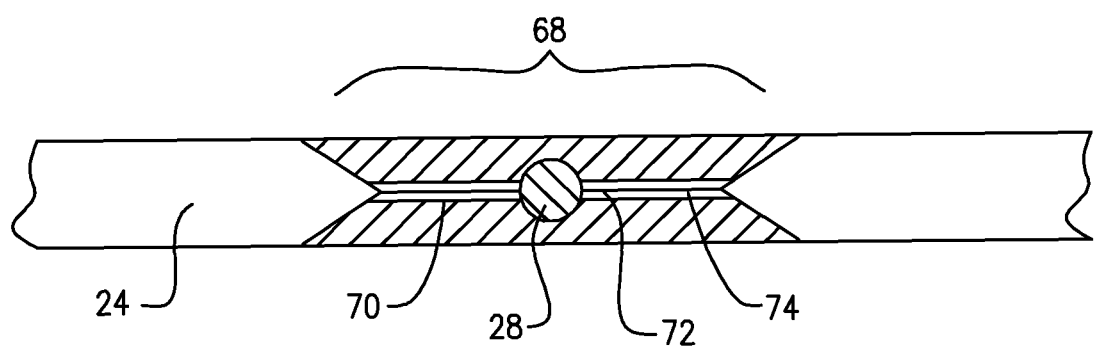
FIG. 9 is a side outside view of another embodiment of the movable tension elements in Region B of FIG. 1.

Referring now to FIG. 9, in an alternative embodiment, the movable tension elements 28 may be connected to the exterior surface of the side wall portions 16 and/or the exterior surface of the bottom portion 22 by a thin strip 70 of the second material 24 that defines at least one junction 72 between at least one movable tension elements 28 and a portion of the first portion 14 in the deflection zone 68. The strip 70 may be sufficiently thin and elastic such that it has a greater elasticity compared to the surrounding side wall portion 16. At least one thin strip 70 may be included on either side of the movable tension element 28 and may connect the movable tension element 28 to the exterior surface of the side wall portion 16. The thickness of the thin strip 70 may be less than the thickness of the surrounding side wall portion 16. The portion of the side wall portions 16 in which the strips 72 are disposed between, and that defines the deflection zone 68, may be composed of the first material 20 or the second material 24 and may define a opening 74 between the thin strip 72 and side wall portion 16. The opening 74 may be included on both sides of the thin strip 72 to facilitate the movement of the movable tension elements 28 during an impact event. The opening 74 may further be sized to allow movement of the movable tension element 28 by defining an aperture to facilitate the movement of the movable tension element 28.

Referring now to FIG. 10, the movable tension element 28 may be in the form of nub or other blunt-tipped and soft structure molded or otherwise coupled to the strip 70 to define junction 72. When an impact force is applied to the housing 12, the movable tension elements 28 may be displaced outwardly by the mobile electronic device, illustrated in FIG. 10 by the broken lines. For example, each thin strip 70 may elastically expand, similar to a rubber band, to facilitate the movement of the movable tension elements 28 toward the side wall portions 16. The movable tension element 28 may extend an outward distance beyond the exterior surface of the side wall portions 16 in its resting state or may alternatively be substantially co-planar with the major axis of the exterior surface of the side wall portions 16.

Referring now to FIG. 11, the movable tension element 28 may be similar in shape and size to the movable tension element 28 shown in FIG. 10, however, in this configuration, the strips 72, while thin and resilient, also define a concavity with the exterior surface of the side wall portions 16. In particular, the strips 72 may be angled inward such that when a force is applied to the movable tension elements 28, the strips 72 are pushed outward to a position in which they are substantially co-planar with the major axis of the side wall portions 16. Alternatively, the exterior surface side wall portions 16 may define a concavity at the deflection zone 68 such that the thickness of the side wall portions 16 is less than the thickness of the side wall portions 16 outside the deflection zone 68 to facilitate the resilient movement of the movable tension element 28.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A case for a mobile device, comprising:
 a housing sized to at least partially retain the mobile device, the housing defining an interior, and a plurality of side wall portions substantially surrounding the interior, the plurality of side walls including an interior surface and an exterior surface; and
 at least one resiliently movable tension element molded to a portion of the side wall portions, the at least one resiliently movable tension element being entirely displaceable between a first position within the interior of the housing to a second position substantially parallel to the exterior surface of the plurality of side wall portions.

2. The case of claim 1, wherein the at least one resiliently movable tension element defines a junction with the exterior surface, the junction having a resilient strip connecting the resiliently movable tension element to the exterior surface.

3. The case of claim 1, wherein the at least one resiliently movable tension element includes a nub, and wherein the nub extends into the interior of the housing.

4. The case of claim 1, wherein the at least one resiliently movable tension element contacts and applies tension to the mobile device when the mobile device is inserted within the housing.

5. The case of claim 1, wherein the housing includes a first portion removeably securable to a second portion, and wherein the plurality of side wall portions and the interior portion are included on the first portion.

6. The case of claim 1, wherein the exterior surface of the plurality of side wall portions defines a major axis, and wherein the at least one resiliently movable tension element is operable to extend an outward distance away from the major axis of the exterior surface when a pushing force is applied to the at least one resiliently movable tension element.

7. The case of claim 1, wherein the at least one resiliently movable tension elements operate to space the mobile device a distance away from the interior surface when the mobile device is retained within the housing.

8. A case for a mobile device, comprising:
 a housing sized to at least partially retain the mobile device, the housing defining an interior surface, an exterior surface, and a plurality of side wall portions defining the interior, each of the plurality of side wall portions having a major axis;
 at least one resiliently movable tension element affixed to the exterior surface of each of the plurality of side wall portions, the at least one resiliently movable tension element extending into the interior of the housing; and
 the at least one resiliently movable tension element being entirely displaceable between a first biased position in which the at least one resiliently movable tension element extends into the interior of the housing to a second position in which the at least one resiliently movable tension element is substantially co-planar with the major axis of its corresponding side wall portion.

9. The case of claim 8, wherein the at least one resiliently movable tension element includes a nub, and wherein the nub extends into the interior of the housing.

10. The case of claim 8, wherein when the at least resiliently movable tension element is in the first position the at least one resiliently movable tension element applies a force to the mobile device when the mobile device is retained within the housing.

11. The case of claim 8, wherein the at least one resiliently movable tension element defines a junction with a corresponding side wall, the junction having a resilient strip connecting the resiliently movable tension element to the corresponding side wall portion.

12. The case of claim 8, wherein at least one of the at least one resiliently movable tension element is molded to each of the plurality of side wall portions.

13. The case of claim 8, wherein at least one of the plurality of side wall portions includes a resilient material molded to the exterior surface, and wherein the at least resiliently movable tension element is coupled to the resilient material.

14. A case for a mobile device, comprising:
- a housing sized to at least partially retain a mobile device, the housing defining an interior, a plurality of side wall portions substantially surrounding the interior and a back portion, each of the plurality of side wall portions and the back portion including:
  - an exterior surface;
  - an interior surface having a substantially rigid layer, the substantially rigid layer having a plurality of openings; and
  - a resilient layer of material disposed on at least a portion of the exterior surface; and
- at least one resiliently movable tension element molded to the exterior surface of each of the plurality of side wall portions, the at least one resiliently movable tension element being entirely displaceable through a corresponding opening in the substantially rigid layer into the interior of the housing; and
- the at least one resiliently movable tension element being configured to space the mobile device a distance away from the plurality of side wall portions when the mobile device is retained within the housing.

\* \* \* \* \*